(12) United States Patent
Gulvin et al.

(10) Patent No.: US 7,060,522 B2
(45) Date of Patent: Jun. 13, 2006

(54) MEMBRANE STRUCTURES FOR MICRO-DEVICES, MICRO-DEVICES INCLUDING SAME AND METHODS FOR MAKING SAME

(75) Inventors: Peter M. Gulvin, Webster, NY (US); Elliott A. Eklund, Penfield, NY (US); Joel A. Kubby, Rochester, NY (US)

(73) Assignee: Xerox Corporation, Stamford, CT (US)

( * ) Notice: Subject to any disclaimer, the term of this patent is extended or adjusted under 35 U.S.C. 154(b) by 0 days.

(21) Appl. No.: 09/986,107

(22) Filed: Nov. 7, 2001

(65) Prior Publication Data

US 2003/0087468 A1   May 8, 2003

(51) Int. Cl.
*H01L 21/00* (2006.01)
(52) U.S. Cl. .......................... 438/53; 438/739
(58) Field of Classification Search ............ 438/49, 438/50, 53, 54, 57, 689, 739
See application file for complete search history.

(56) References Cited

U.S. PATENT DOCUMENTS

| | | | |
|---|---|---|---|
| 4,740,410 A * | 4/1988 | Muller et al. ............... | 428/133 |
| 5,501,893 A | 3/1996 | Laermer et al. | |
| 5,783,340 A | 7/1998 | Farino et al. | |
| 5,798,283 A | 8/1998 | Montague et al. | |
| 5,804,084 A | 9/1998 | Nasby et al. | |
| 5,919,548 A | 7/1999 | Barron et al. | |
| 5,963,788 A | 10/1999 | Barron et al. | |
| 6,053,208 A | 4/2000 | Onishi et al. | |
| 6,127,198 A | 10/2000 | Coleman et al. | |
| 6,587,613 B1 * | 7/2003 | De Natale ................... | 385/18 |
| 2003/0071015 A1 * | 4/2003 | Chinn et al. ................ | 216/36 |
| 2003/0152815 A1 * | 8/2003 | LaFollette et al. ......... | 429/7 |

OTHER PUBLICATIONS

Merriam Webster's Collegiate Dictionary (2001), Merriam Webster Inc., Tenth Edition, p. 190.*
U.S. Appl. No. 09/723,243, filed Nov. 28, 2000, Gooray et al.

* cited by examiner

*Primary Examiner*—Stephen W. Smoot
(74) *Attorney, Agent, or Firm*—Oliff & Berridge, PLC

(57) ABSTRACT

A structure for a micro-device is fabricated by forming: a first layer of sacrificial material, a layer of structural material over the first sacrificial material layer, a second layer of sacrificial material over the structural material layer and a protective layer over the second sacrificial material layer. A release etch is used to remove the first and second sacrificial material layers at approximately the same rate. A structural feature may also be fabricated by forming: a first layer of a first material; a layer of structural material over the first layer of the first material; at least one cut in the structural material layer; and, a first layer of a sacrificial material, different from the first material, over the structural material layer such that an interface is created between the first layer of the sacrificial material and the first layer of the first material at the at least one cut.

14 Claims, 11 Drawing Sheets

MEMBRANE STRUCTURES FOR MICRO-DEVICES, MICRO-DEVICES INCLUDING SAME AND METHODS FOR MAKING SAME

BACKGROUND OF THE INVENTION

1. Field of Invention

This invention relates to methods for forming membrane structures for micro-devices, to the membrane structures themselves and to micro-devices including membrane structures.

2. Description of the Related Art

Various micro-devices are known that include a membrane structure are known. For example, fluid-handling micro-devices are known that use a membrane structure to control movement of a fluid. Exemplary micro-devices include micromachined fluid ejection devices for ink jet recording or printing, for depositing photoresist and other liquids in the semiconductor and flat panel display industries, for delivering drug and biological samples, for delivering multiple chemicals for chemical reactions, for handling DNA sequences, for delivering drugs and biological materials for interaction studies and assaying, or for depositing thin and narrow layers of plastics for usable as permanent and/or removable gaskets in micro-machines. See, for example, U.S. Pat. No. 6,127,198 to Coleman et al., incorporated herein by reference in its entirety.

Various fabrication techniques are known for such micro-devices, such as, surface and/or bulk micromachining techniques. Planar fabrication process steps common to the integrated circuit (IC) fabrication industry may be used to manufacture microelectromechanical or micromechanical devices. The standard building-block process consists of depositing and photolithographically patterning alternating layers on a substrate. The alternating layers consist of low-stress polycrystalline silicon (also termed polysilicon) and a sacrificial material such as silicon dioxide on a substrate. Vias etched through the sacrificial layers provide anchor points to the substrate and between the polysilicon layers. The polysilicon layers are patterned to form mechanical elements of the micromachined device. The mechanical elements are thus formed layer-by-layer in a series of deposition and patterning process steps. The silicon dioxide layers are then removed by exposure to a selective etchant, such as hydrofluoric acid (HF), which does not etch the polysilicon layers. This releases the mechanical elements formed in the polysilicon layers for movement thereof. Again, see the incorporated '198 patent, for example.

The resulting micromachined device generally consists of a first layer of polysilicon which provides electrical interconnections and/or a voltage reference plane, and up to three additional layers of polysilicon which include mechanical elements ranging from simple cantilevered beams to complex systems, such as an electrostatic motor connected to a plurality of gears. Typical in-plane lateral dimensions can range from one micron to several hundred microns, while the layer thicknesses are typically about 0.5–2 microns. Because the entire process is based on standard IC fabrication technology, hundreds to thousands of devices can be batch-fabricated, fully assembled (without any need for piece-part assembly) on a single silicon substrate.

In particular, micro-devices may be fabricated using the SUMMiT processes. The SUMMiT processes are covered by various U.S. patents belonging to Sandia National Labs, including U.S. Pat. Nos. 5,783,340; 5,798,283; 5,804,084; 5,919,548; 5,963,788; and 6,053,208, each of which is incorporated herein by reference in its entirety. The SUMMiT processes are primarily covered by the '084 and '208 patents. In particular, the methods discussed in copending U.S. patent application Ser. No. 09/723,243 filed Nov. 28, 2000, incorporated herein by reference in its entirety, may be used.

A chemical mechanical polishing (CMP) technique that planarizes the various levels in a multilevel micromachined device to prevent unintended interference between structures on different layers of the micromachined device is described in U.S. Pat. No. 5,804,084 to Nasby et al. In the above-described process, as the relatively thick (2 µm) layers of polysilicon and oxide are deposited and etched, considerable surface topography arises which imposes limitations in deposition, patterning and etching of subsequent layers. The topography is created as the layers are draped into valleys created by prior etching steps. It is often desirable to planarize specific layers in order to eliminate processing difficulties associated with photoresist-step coverage, depth-of-focus of photolithography equipment, and stringer generation during dry etch. The chemical mechanical polishing of intermediate sacrificial layers as disclosed in U.S. Pat. No. 5,804,084 provides relatively simple and quick processing to ameliorate the topography difficulties inherent in multi-level micro-machining processes. This avoids the need for additional care in design of structures, special photoresist processes and the use of extra mask levels.

An anisotropic etching process may be used to define structures, for example trenches and ridges or the like having low to average selectivity, into silicon substrates. Individual structures to be etched in are usually defined by etching masks applied to the silicon substrate by way of so-called masking layers, for example, a photoresist layer. In the anisotropic etching technique, it is necessary to achieve a laterally exactly defined recess in the silicon. These deeply-extending recesses must have lateral ends which are as exactly vertical as possible. The edges of the masking layers covering those silicon substrate regions that are not supposed to be etched are not underetched in order to keep the lateral precision of the structural transition from the mask into the silicon as high as possible. As a result, it is necessary to allow the etching to progress only on the bottom of the structures, but not on the already produced side walls of the structures.

To this end, a plasma-etching method may be used to perform etching of profiles in silicon substrates. In such a method, chemically reactive species and electrically-charged particles (ions) are generated in a reactive gas mixture in a reactor with the aid of an electric discharge. The positively-charged cations generated in this manner are accelerated toward the substrate, by means of an electrical prestress applied to the silicon substrate, and fall virtually vertically onto the substrate surface, and promote the chemical reaction of the reactive plasma species with the silicon on the etching base.

A particular type of anisotropic etching process is described in U.S. Pat. No. 5,501,893 to Laermer et al. This particular type of etching process is commonly referred to as a Bosch etch. According to a Bosch etch, the anistropic etching process is achieved by alternating sequential etching and polymerization steps. As a consequence, in an advantageous manner the simultaneous presence of etching species and polymer formers in the plasma is avoided altogether. Hence, deep structures having vertical edges can be realized with very high etching rates in silicon substrates.

SUMMARY OF THE INVENTION

The systems and methods of this invention provide membrane structures with reduced etch-induced bowing.

The systems and methods of this invention separately provide micro-devices with membrane structures having reduced etch-induced bowing.

The systems and methods of this invention separately provide membrane structures in which strength gradients of upper and lower portions are approximately the same.

The systems and methods of this invention separately provide micro-devices with membrane structures in which strength gradients of upper and lower portions are approximately the same.

The systems and methods of this invention separately and independently provide reduce release etch time for fabrication of micro-structures and micro-devices.

The systems and methods of this invention separately provide micro-structures of micro-devices that are subjected to less damage from release etching during fabrication.

In various exemplary embodiments of the methods of this invention, a membrane of a structural material for a micro-device is fabricated by: forming a first layer of sacrificial material; forming a first layer of structural material over the first layer of sacrificial material; forming a second layer of sacrificial material over the first layer of structural material; forming a protective layer over the second layer of sacrificial material; and subjecting the first and second layers of sacrificial material to a release etch to remove the first and second layers of sacrificial material at approximately the same rate. In various embodiments, the protective layer is removed after subjecting the first and second layers of sacrificial material to the release etch. In various embodiments, the protective layer is removed mechanically. In other various embodiments, the protective layer is removed chemically.

According to various exemplary embodiments, the first layer of structural material may be formed by a layer of polysilicon. In various embodiments, the protective layer may be formed by a protective layer of polysilicon. In other embodiments, the first layer of structural material and/or the protective layer may be formed by a layer of single crystal silicon. The first and second layers of sacrificial material may be formed by first and second layers of oxide. According to various exemplary embodiments, the protective layer may be formed by forming a plurality of support legs outside a periphery of the first layer of structural material and forming a protective layer over the second layer of sacrificial material and attached to the support legs. In various embodiments, the plurality of support legs and the protective layer may be polysilicon. In other various embodiments, the plurality of support legs may be nitride.

According to further exemplary embodiments of this invention, a membrane fabricated according to any of the above embodiments may be fabricated by the further steps of: forming a second layer of structural material over which the first layer of sacrificial material is formed; forming at least one cut in the second layer of structural material; and forming at least one cut in the protective layer. In various exemplary embodiments, a third layer of material is formed over which the second layer of structural material is formed, such that an interface is created between the first layer of sacrificial material and the third layer of material at the at least one cut in the second layer of structural material; and a fourth layer of material is formed over the protective layer such that an interface is created between the second layer of sacrificial material and the fourth layer of material at the at least one cut in the protective layer.

In various embodiments, the first and second layers of sacrificial material are formed by layers of a first sacrificial material and the third and fourth layers of material are formed by layers of a material that is different from the first sacrificial material.

In various exemplary embodiments of the methods of this invention, a membrane of a structural material for a micro-device is fabricated by: forming a first layer of a first material; forming a first layer of structural material over the first layer of the first material; forming at least one cut in the first layer of structural material; forming a first layer of a sacrificial material, different from the first material, over the first layer of structural material such that an interface is created between the first material and the sacrificial material at the at least one cut in the first layer of structural material; and subjecting the first layer of the sacrificial material to a release etch to remove the first layer of the second sacrificial material.

According to various exemplary embodiments, the first layer of structural material is formed by a layer of polysilicon. In other embodiments, the first layer of structural material is formed by a layer of single crystal silicon. In various embodiments, the at least one cut in the first layer of structural material may comprise at least one channel.

In various embodiments, the first layer of the first material may be formed by a first layer of nitride and the first layer of sacrificial material may be formed by a first layer of oxide. In various embodiments, a second layer of structural material is formed over the first layer of oxide. According to further exemplary embodiments of this invention, a membrane fabricated according to any of the above embodiments may be fabricated by the further steps of: forming a second layer of oxide over the second layer of structural material; forming a protective layer over the second layer of oxide; forming at least one cut in the protective layer; forming a second layer of nitride over the protective layer such that an oxide-nitride interface is created at the at least one cut in the protective layer; and subjecting the second layer of oxide to the release etch to remove the second layer of oxide.

These and other features and advantages of this invention are described in, or are apparent from, the following detailed description of various exemplary embodiments of the methods and devices according to this invention.

BRIEF DESCRIPTION OF THE DRAWINGS

Various exemplary embodiments of the methods and devices of this invention are described in detail below, with reference to the attached drawing figures, in which.

DETAILED DESCRIPTION OF PREFERRED EMBODIMENTS

The methods of this invention may be used in the fabrication of a wide variety of micro-devices. For example, surface micromachining techniques may be used for fabricating various types of ink jet ejectors. In particular, electrostatically and magnetically actuated liquid ejectors fabricated using such techniques have the potential for compact, integrated, monolithic (little or no assembly required) fabrication with drop size modulation. Thus, the present invention builds upon existing surface micromachining techniques to provide distinct advantages in the fabrication of micromachined devices and structures thereof, in particular, micromachined membrane structures and microdevices that include a membrane structure.

While exemplary embodiments of this invention are described herein with reference to a micromachined fluid ejector, it should be understood that the systems and methods of this invention are suitable for fabrication of any known or hereafter developed micro-device. Further, while the methods of this invention are described herein with reference to membrane structures, it should be understood that the systems and methods of this invention are suitable for fabrication of any known or hereafter developed microstructure.

Figure 1:
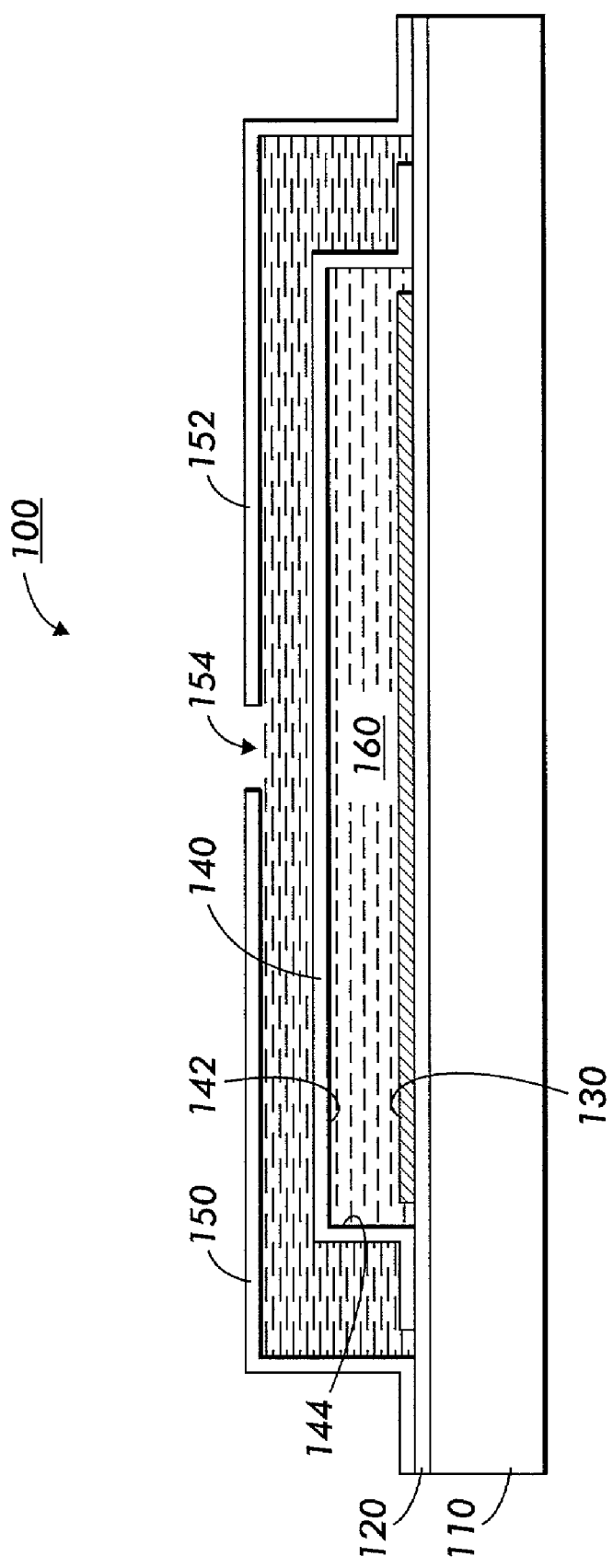
FIG. 1 is a cross-sectional view of an exemplary embodiment of a micromachined fluid ejector that may be fabricated according to the methods of this invention.

Thus, by way of example only, a cross-sectional view of an exemplary embodiment of a micromachined fluid ejector 100 is shown in FIG. 1. An insulator or isolation layer 120 is formed over a relatively thick substrate 110. The isolation layer 120 may be formed, for example, by a nitride layer, such as silicon nitride. The substrate 110 may be formed, for example, by a silicon layer. An electrode 130 is formed over the isolation layer 120. The electrode 130 may be formed, for example, by a polysilicon layer. A membrane structure 140 is formed over the electrode 130. The membrane structure 140 may comprise a membrane 142 supported by one or more membrane anchors 144 connected to the isolation layer 120. The membrane structure 140 may be formed, for example, by another polysilicon layer. A faceplate structure 150 is formed over the membrane structure 140. The faceplate structure 150 may comprise a faceplate 152 with one or more nozzle holes 154. The faceplate structure 150 may be formed, for example, by a polyimide layer. A membrane chamber 160 is defined between the membrane structure 140 and the isolation layer 120. A fluid ejection chamber 170 is defined between the faceplate structure 150 and the membrane structure 140.

During fabrication, layers of sacrificial material are formed and etched to define the structures of the ejector 100. These layers of sacrificial material are not shown in FIG. 1, however, because they are removed, typically by a release etch, as the fabrication process is executed. For example, a first layer of sacrificial material would have been removed from between the membrane structure 140 and the electrode 130 and a second layer of sacrificial material would have been removed from between the membrane structure 140 and the faceplate structure 150 to release the membrane 142 for movement.

Fabrication of the ejector 100 using known bulk and surface micromachining techniques entails certain drawbacks. For example, fabrication of an extended polysilicon structure such as the membrane 142 would generally require etch holes about every 30 microns to allow the etchant access to the sacrificial material defining the membrane chamber 160. However, etch holes would allow the fluid to be ejected from the ejection chamber 170 to leak into the membrane chamber 160 during use.

Instead of forming etch holes in the membrane 142, lateral etch holes may be formed in or between the membrane anchors 144 to allow the etchant access to the sacrificial material defining the membrane chamber 160. The lateral etch holes are plugged after the release etch is completed.

As described further below, the release etch takes longer to remove the sacrificial material using the lateral etch holes, resulting in undesirably long exposure of the membrane 142 and other structures of the ejector 100 to the etchant and potential damage. Furthermore, because the sacrificial material above the membrane 142 is completely exposed to the etchant, the upper surface of the membrane 142 is exposed to the etchant for a longer time than portions of the lower surface of the membrane 142 remote from the lateral etch holes. When the membrane 142 is formed of a material having inherent stress, such as polysilicon, the resulting weakening of the upper surface of the membrane 142 relative to the lower surface of the membrane 142 allows the membrane 142 to bow outward away from the electrode 130. For the ejector 100, the increased distance between the electrode 130 and the membrane 142 requires a corresponding increase in the actuation voltage needed to move the membrane 142 using an electric field generated using the electrode 130, and may even render the ejector 100 useless.

This invention provides solutions to these problems. According to various embodiments of this invention, a membrane structure or the like can be fabricated without etch-induced bowing. In various embodiments of this invention, an upper layer of the membrane structure will have a strength gradient that is approximately the same as a strength gradient of a lower layer of the membrane structure. According to various embodiments of this invention, a protective layer is formed over the layer of sacrificial material that is formed over the membrane structure. The protective layer allows the etchant only lateral access to the sacrificial material formed over the membrane structure, similar to the access provided by the lateral access holes.

Thus, the etchant attacks the layers of sacrificial material on each side of the membrane at approximately the same rate.

According to various embodiments of this invention, a membrane structure or the like can be fabricated with reduced damage from a release etch used to remove layers of sacrificial material. In various embodiments of this invention, the time required to remove layers of sacrificial materials using a release etch is reduced. According to various embodiments of this invention, at least one cut is formed in a layer of structural material that is formed over on a sacrificial layer, or over which a layer of sacrificial material is formed. The at least one cut provides the etchant with additional access to the layer of sacrificial material. Furthermore, in various embodiments, a layer of another sacrificial material that is different from the sacrificial material of the layer to be removed is formed on a side of the layer of structural material opposite the layer of sacrificial material to be removed. An interface is created between the two sacrificial materials at the at least one cut. The release etch proceeds more quickly at the interface.

Figure 2:
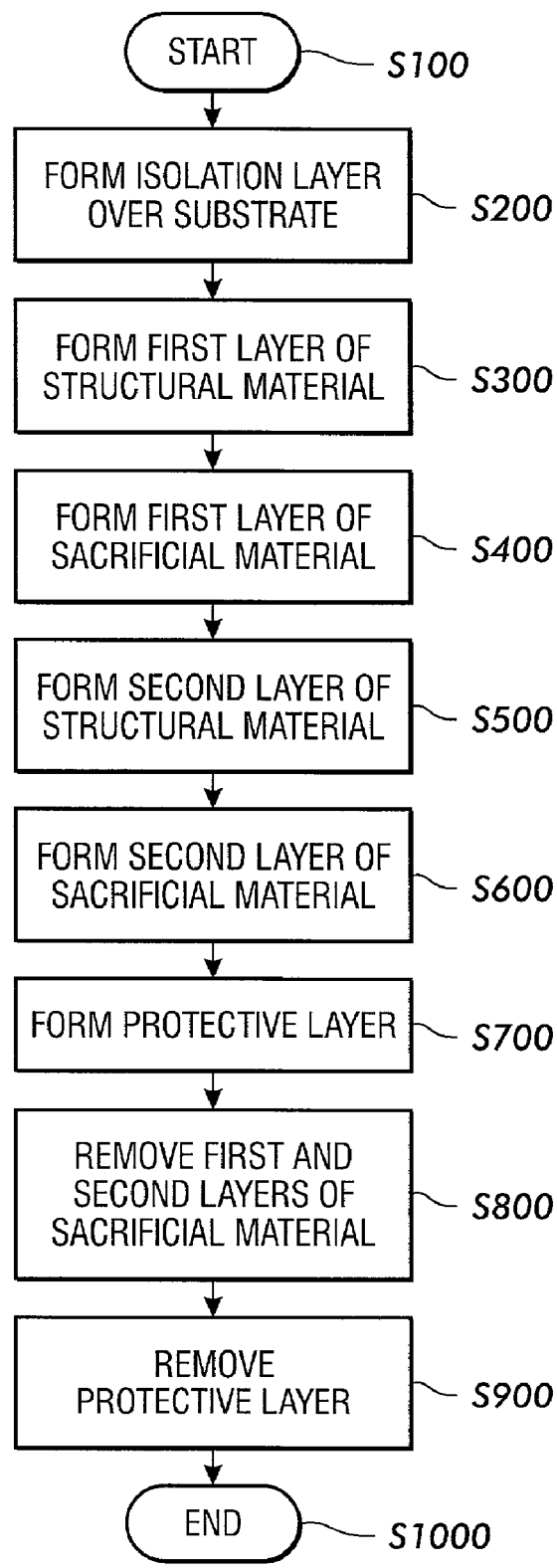
FIG. 2 is a flowchart outlining a first exemplary embodiment of a method for fabricating a micromachined device according to this invention.

FIG. 2 is a flowchart outlining a first exemplary embodiment of a method for fabricating a micromachined device according to this invention. The fabrication process begins at step S100, for example, with a substrate, such as silicon. In step S200, an isolation layer is formed over the substrate. The isolation layer may be any suitable dielectric, such as, for example, silicon nitride. A first layer of structural material is then formed over the isolation layer in step S300. The first layer of structural material may be, for example, polysilicon or single-crystal silicon. While steps S100–S300 are shown as individual steps, it should be understood that the process may begin with a prefabricated silicon-on-insulator wafer.

The first layer of structural material may be processed as desired, such as by an etching process prior to proceeding to step S400. In step S400, a first layer of sacrificial material is formed over the first layer of structural material. Then, in step S500, a second layer of structural material is formed over the first layer of sacrificial material. A second layer of sacrificial material is formed over the second layer of structural material in step S600 and a protective layer is formed over the second layer of sacrificial material in step S700. The protective layer may be formed of any suitable material such as, for example, polysilicon or single crystal silicon.

The first and second layers of sacrificial material are removed in step S800. For example, the first and second layers of sacrificial material may be subjected to a release etch, such as hydrofluoric acid, that is not allowed to significantly attack the materials of the other layers. Because the first and second layers of sacrificial material are completely covered by other layers, except for the sides, the etchant will attack the first and second layers of sacrificial material in a similar manner. Thus, both surfaces of the second layer of structural material disposed between the first and second layers of sacrificial material will have similar exposure to the etchant.

After the first and second layers of sacrificial material are removed, the protective layer may be removed in step S900, for example, either mechanically or chemically. The protective layer, however, may form another structural layer of the device. In that case, step S900 would not be executed. The process then ends in step S1000. It should be understood, however, that further processing is possible to obtain the finished device.

Figure 3:
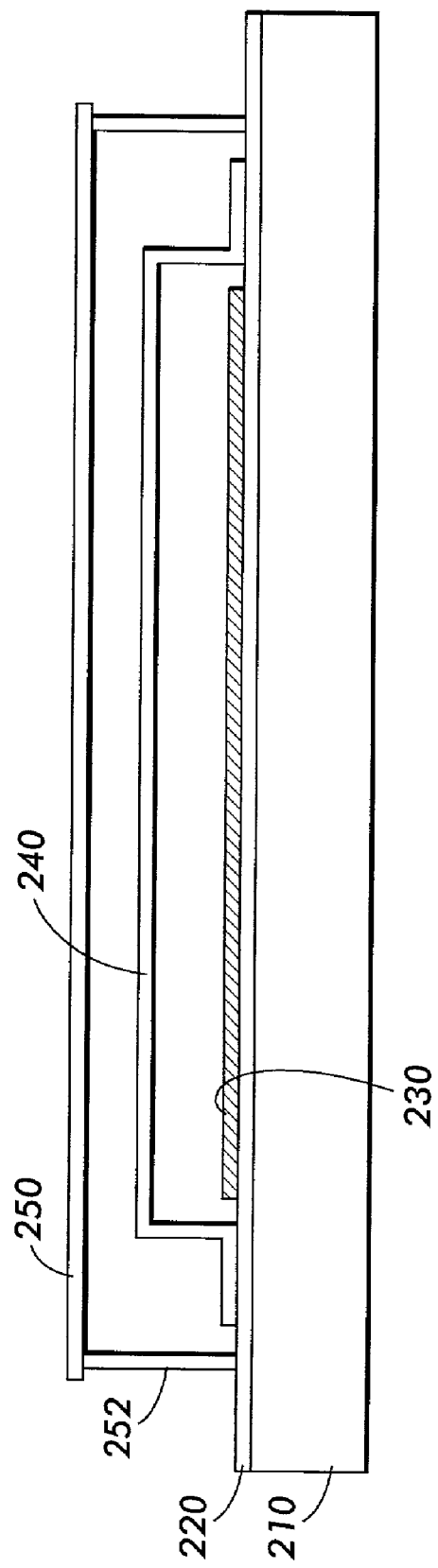
FIG. 3 is a cross-sectional view of the exemplary ejector of FIG. 1 in a stage of fabrication according to the first exemplary method of this invention.
Figure 4:
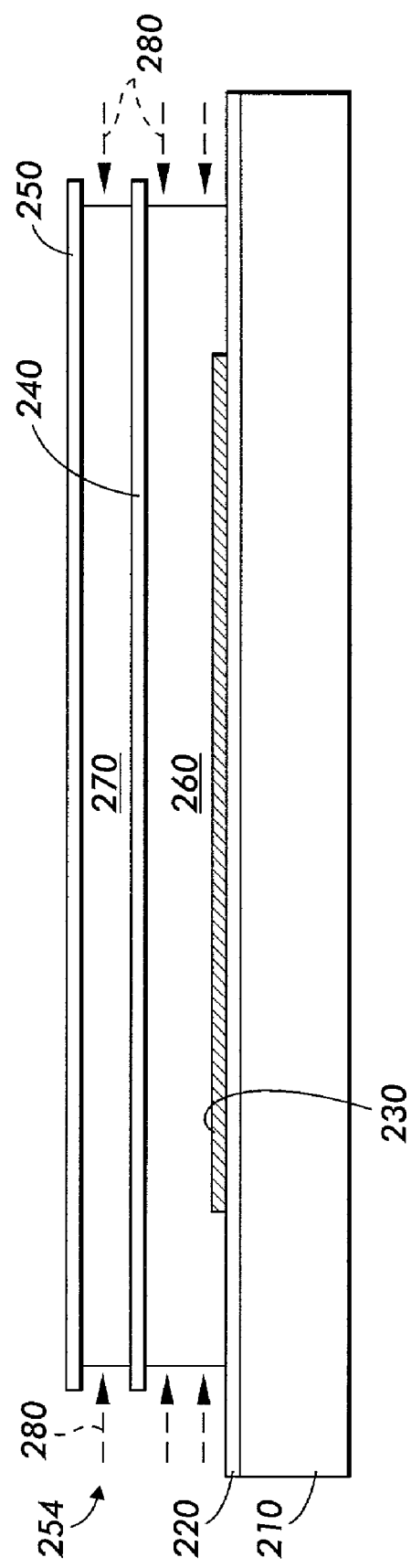
FIG. 4 is a cross-sectional view of the exemplary ejector of FIG. 3, taken along the lateral etch holes, subjected to a release etch step according to the first exemplary method of this invention.

FIGS. 3 and 4 show the exemplary ejector of FIG. 1 in a stage of fabrication according to the first exemplary method of this invention. As shown, an isolation layer 220 is formed over a substrate 210 and an electrode 230 is formed over the isolation layer 220. A first layer of sacrificial material 260 is formed over the electrode 230. A first layer of structural material 240, which forms the membrane structure (membrane and membrane anchors) for the ejector, is formed over the first layer of sacrificial material 260. A second layer of sacrificial material 270 is formed over the first layer of structural material 240.

According to the first exemplary method of this invention, a protective layer 250 is formed over the second layer of sacrificial material 270. As shown, the protective layer 250 may be formed on one or more support legs 252 that connect, for example, to the isolation layer 220. According to this method, the support legs 252 should be spaced apart or otherwise include through holes 254, as shown in FIG. 4, corresponding to the lateral etch holes formed in or between the membrane anchors to allow the etchant access to the first and second layers of sacrificial material 260 and 270.

As illustrated by arrows in FIG. 4, the first exemplary method employs a release etch in which an etchant 280 removes the first and second layers of sacrificial material 260 and 270. Since both the first and second layers of sacrificial material 260 and 270 are covered everywhere except for the lateral etch holes and the corresponding through holes 254, the etchant 280 attacks the first and second layers of sacrificial material 260 and 270 in a similar manner.

Figure 5:
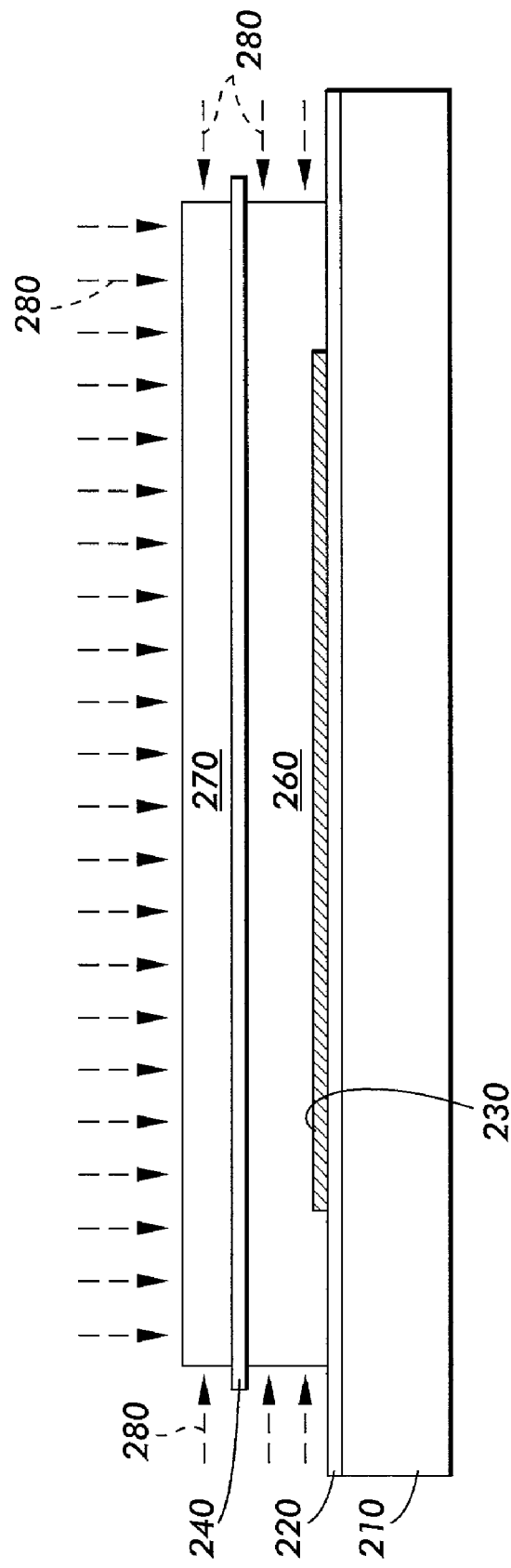
FIG. 5 is a cross-sectional view of an ejector subjected to a release etch step according to a different method.

FIG. 5 is a cross-sectional view of an ejector subjected to a release etch step in which the protective layer 250 is omitted so that an upper surface of the second layer of sacrificial material 270 is exposed. As illustrated by arrows in FIG. 5, during the release etch, the etchant 280 is allowed to attack the entire upper surface of the second layer of sacrificial material 270. As a result, of the second layer of sacrificial material 270 is removed at a much higher rate than the first layer of sacrificial material 260, which is only exposed to the etchant via the lateral etch holes. For example, a membrane with a radius of 200 microns that requires a 15 minute etch using the lateral etch holes requires only a 2.5 minute etch when standard etch holes (formed in a layer above the sacrificial material) are used.

In both of the exemplary processes shown in FIGS. 4 and 5, a lower portion of the first layer of structural material 240 is gradually exposed to the etchant 280 as the first layer of sacrificial material 260 is gradually removed. Thus, portions of the lower portion of the first layer of structural material 240 that are closer to the lateral etch holes are subjected to the release etch for a longer time than inner portions of the lower portion of the first layer of structural material 240 that farther from the lateral etch holes. This is illustrated schematically in FIGS. 6 and 7 with a lower portion 242 of the first layer of structural material 240 having portions that are subjected to a relatively strong attack S, a relatively weak attack W and a medium attack M.

In the case where the structural layers are made in polysilicon, the sacrificial material is silicon dioxide and the release etchant is hydrofluoric acid (HF), the mechanism of the attack is presently understood as follows. The boundaries between grains of various crystal orientations in the polysilicon tend to be the collection point for any impurities in the polysilicon layer or film. Some polysilicon films have impurities such as small amounts of oxygen present. When the oxygen conglomerates at the grain boundaries, the oxygen becomes a target for the hydrofluoric acid. This weakens or even breaks apart the surface of the polysilicon film at the grain boundaries.

In the first exemplary method of this invention, an upper portion of the first layer of structural material 240 is also gradually exposed to the etchant 280 as the second layer of sacrificial material 270 is gradually removed. Thus, portions of the upper portion of the first layer of structural material 240 that are closer to the lateral etch holes are subjected to the release etch for a longer time than outer portions of the lower portion of the first layer of structural material 240 that farther from the lateral etch holes. As illustrated schematically in FIG. 6, an upper portion 244 of the first layer of structural material 240 has portions that are subjected to the relatively strong attack S, the relatively weak attack W and the medium attack M.

However, according to the exemplary process shown in FIG. 5, substantially all of the upper portion 244 of the first layer of structural material 240 is exposed to the etchant 280 at substantially the same time, as soon as the second layer of sacrificial material 270 is removed. Because the etchant 280 attacks the entire upper surface of the second layer of sacrificial material 270, the entire upper portion 244 of the first layer of structural material 240 is subjected to the relatively strong attack S.

The attack of the etchant 280 on the first layer of structural material 240 weakens the first layer of structural material 240. As such, the relatively strong attack S causes more damage than the medium attack M, which causes more damage than the relatively weak attack W. Accordingly, the first layer of structural material 240 is subjected to differing levels of attack using lateral etch holes, the first layer of structural material 240 will have a strength gradient toward its center, the portions subjected to the relatively strong attack S being stronger than the portions subjected to the medium attack M, which are stronger than the portions subjected to the relatively weak attack W.

Figure 7:
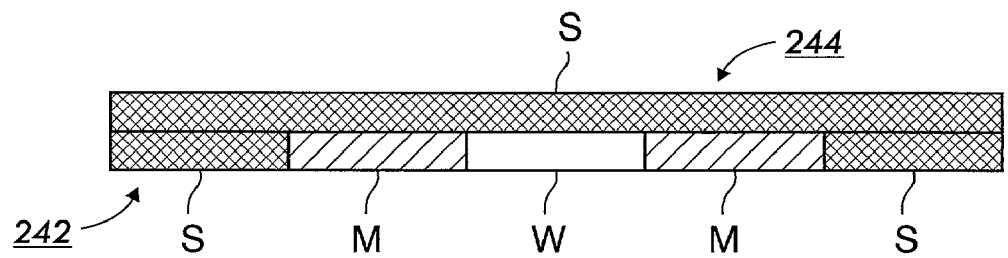
FIG. 7 is a schematic representation of the degree of attack experienced by the membrane structure during the release etch step of FIG. 5.

As shown in FIG. 7, the exemplary processes of FIG. 5 causes the upper portion 244 to not have a strength gradient similar to the lower portion 242. Because the entire upper portion 244 is subjected to the relatively strong attack S, the entire upper portion 244 is weaker than the portions of the lower portion 242 that are subjected to the medium attack M and the relatively weak attack W. Inherent stress in the first layer of structural material 240 will cause the first layer of structural material 240 to bow. That is, the first layer of structural material 240 will bend so that the upper portion 244 is convex and the lower portion 242 is concave. As discussed above, this is an undesirable result.

Figure 6:
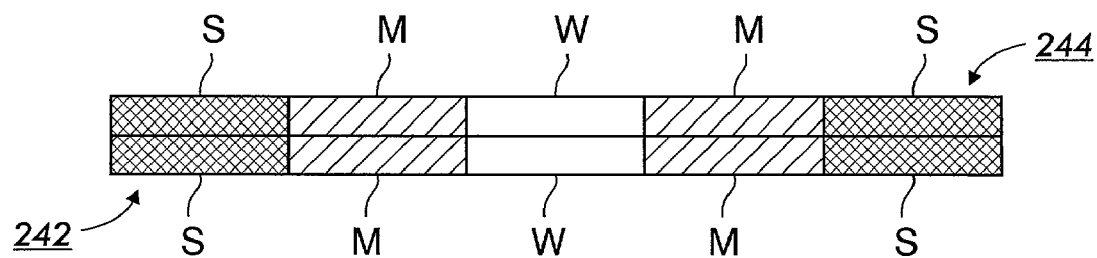
FIG. 6 is a schematic representation of the degree of attack experienced by the membrane structure during the release etch step of FIG. 4.

As shown in FIG. 6, however, the first exemplary method of this invention causes the lower and upper portions 242 and 244 to have strength gradients that are approximately the same. This reduces, or even eliminates, any etch-induced bowing of the first layer of structural material 240.

Figure 8:
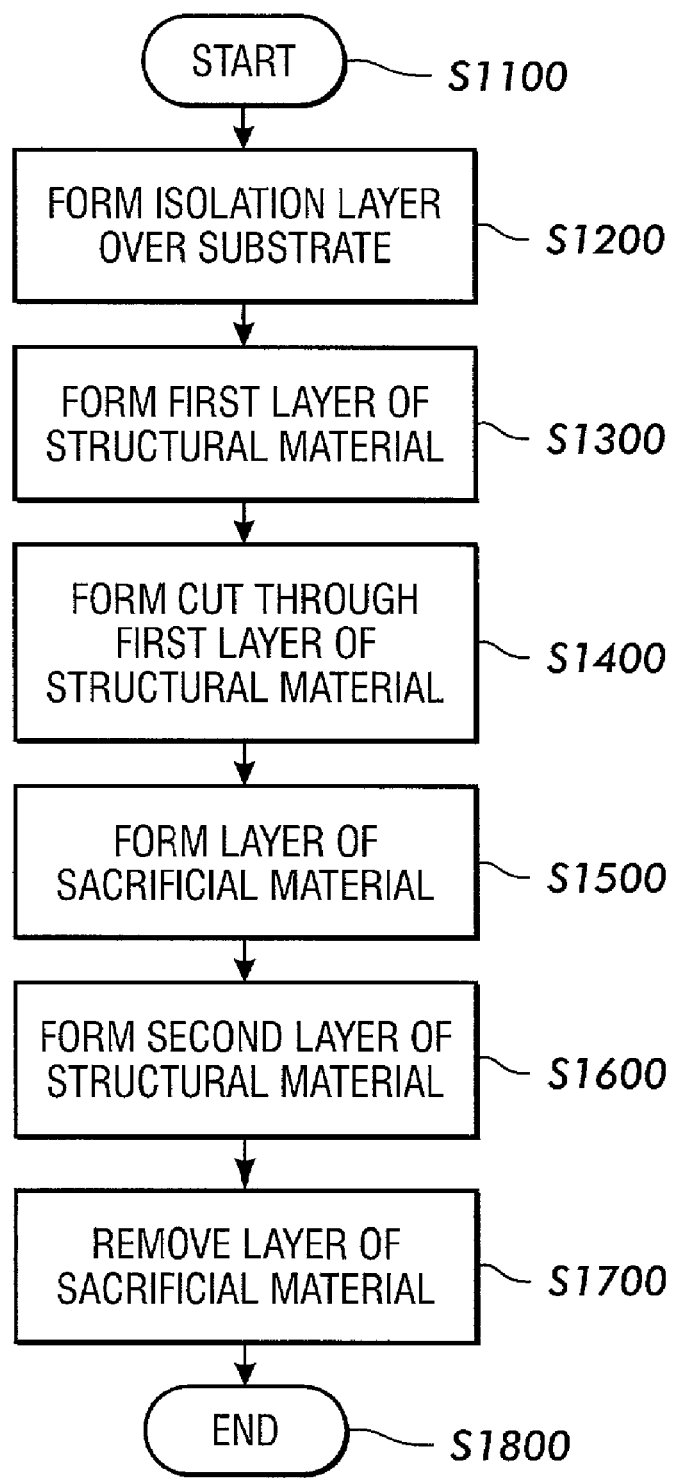
FIG. 8 is a flowchart outlining a second exemplary embodiment of a method for fabricating a micromachined device according to this invention.

FIG. 8 is a flowchart outlining a second exemplary embodiment of a method for fabricating a micromachined device according to this invention. The fabrication process begins at step S1100, for example, with a substrate, such as silicon. In step S1200, an isolation layer is formed over the substrate. The isolation layer may be any suitable dielectric, such as, for example, silicon nitride. A first layer of structural material is then formed over the isolation layer in step S1300. The first layer of structural material may be, for example, polysilicon or single-crystal silicon. While steps S1100–S1300 are shown as individual steps, it should be understood that the process may begin with a prefabricated silicon-on-insulator wafer.

In step S1400, a cut is made through the first layer of structural material to expose part of the isolation layer. Then, in step S1500, a layer of sacrificial material is formed over the first layer of structural material. A second layer of structural material is formed over the layer of sacrificial material in step S1600.

The layer of sacrificial material is then removed in step S1700. For example, the layer of sacrificial material may be subjected to a release etch, such as hydrofluoric acid, that is not allowed to attack the materials of the other layers. Because the layer of sacrificial material is completely covered by other layers, except for the side, the etchant will attack the layer of sacrificial material from the side.

The cut in the first layer of structural material preferably forms a channel that runs from an outer edge at the side. Because of the isolation layer/sacrificial material layer interface at the cut, the etch will proceed more rapidly along such a channel, providing increased access to the sacrificial material for the etchant and reducing the required etch time. Once the layer of sacrificial material is removed, the process ends at step S1800.

Figure 9:
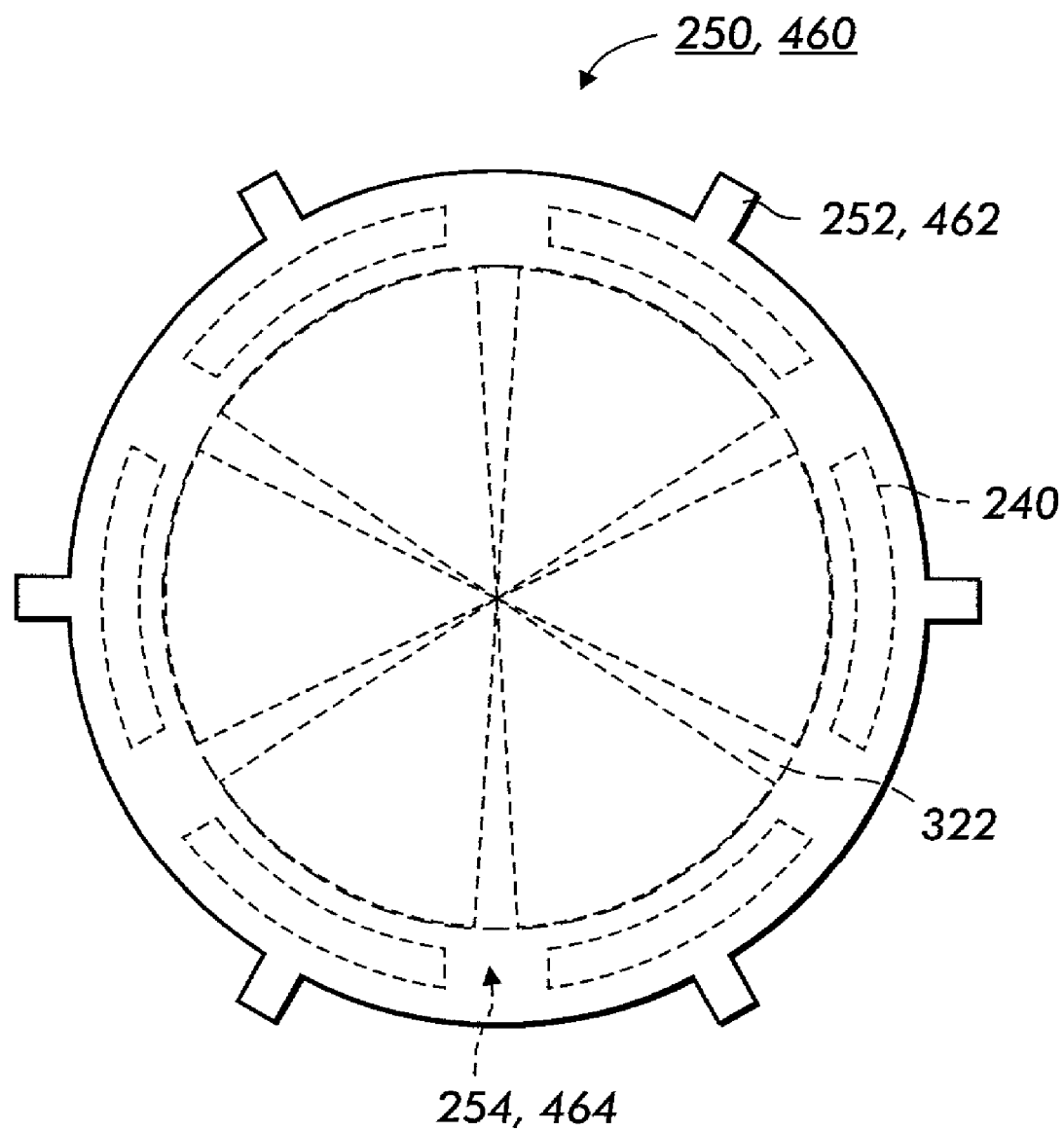
FIG. 9 is a partial top view of the exemplary ejector of FIG. 1, shown at a reduced scale, in a stage of fabrication according to the second exemplary method of this invention.
Figure 10:
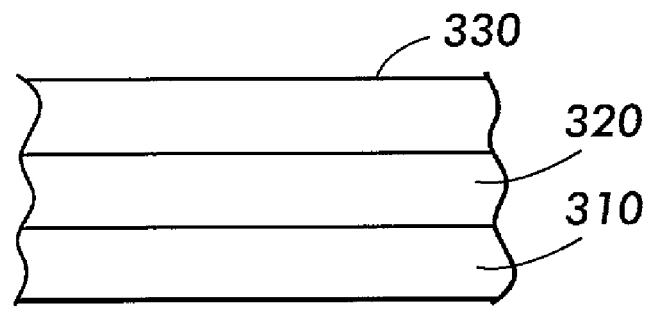
FIG. 10 is a partial cross-section of a portion of the ejector of FIG. 9 without a cut.
Figure 11:
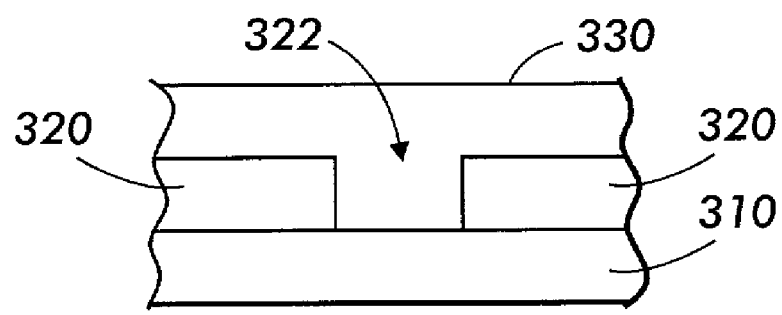
FIG. 11 is a partial cross-section of a portion of the ejector of FIG. 9 with a cut.

FIGS. 9–11 show the exemplary ejector of FIG. 1 in a stage of fabrication according to the second exemplary method of this invention. As shown, a first layer of structural material 320, which forms the electrode for the ejector, is formed over an isolation layer 310 and/or a substrate (not shown). The first layer of structural material 320 includes at least one cut 322. A first layer of a first sacrificial material 330 is formed over the first layer of structural material 320. The first layer of the first sacrificial material 330 forms an interface with the isolation layer 310 at the at least one cut 322. This creates the partial cross-sections shown in FIGS. 10 and 11 without a cut and with a cut, respectively. As shown, the at least one cut 322 may be formed as a channel.

During the release etch, the etchant will remove the first layer of the first sacrificial material 330 more rapidly at the at least one cut 322. This results in reduced etch time for the release etch to remove the first layer of the first sacrificial material 330. Especially when the at least one cut 322 is formed as a channel, the at least one cut 322 allows the etchant to attack more areas of the first layer of the first sacrificial material 330 by channeling the etchant from the lateral etch holes to penetrate into the first layer of the first sacrificial material 330.

The etch time for the release etch to remove the first layer of the first sacrificial material 330 is reduced even further when the first sacrificial material and the isolation layer material are selected appropriately. For example, the isolation layer material may be a nitride, such a silicon nitride. The first sacrificial material may be an oxide, such as silicon dioxide. This provides an oxide-nitride interface at the at least one cuts 322. Experiments have shown that a release etch of hydrofluoric acid will remove the oxide layer more quickly along the oxide-nitride interface than along an oxide-polysilicon interface.

Moreover, experiments have shown that fabrication according to the second exemplary method of this invention can increase the etching speed by 30–50 percent. As noted above, reduced etch times for the release etch will result in less damage to the structural and electrical components of the micro-device. By using a suitable number of cuts, etch time for the release etch should be reduced sufficiently to avoid mechanical degradation and/or open electrical circuits.

Figure 12:
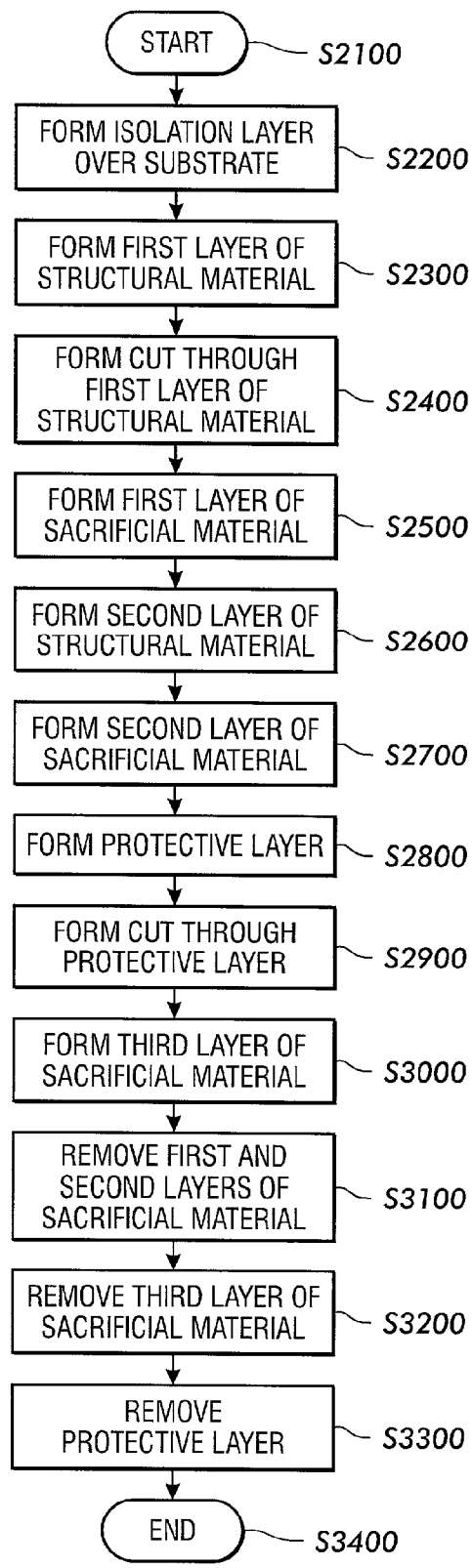
FIG. 12 is a flowchart outlining a third exemplary embodiment of a method for fabricating a micromachined device according to this invention.

FIG. 12 is a flowchart outlining a third exemplary embodiment of a method for fabricating a micromachined device according to this invention. The fabrication process begins at step S2100, for example, with a substrate, such as silicon. In step S2200, an isolation layer is formed over the substrate. The isolation layer may be any suitable dielectric, such as, for example, silicon nitride. A first layer of structural material is then formed over the isolation layer in step S2300. The first layer of structural material may be, for example, polysilicon or single-crystal silicon. While steps S2100–S2300 are shown as individual steps, it should be understood that the process may begin with a prefabricated silicon-on-insulator wafer.

In step S2400, a cut is made through the first layer of structural material to expose part of the isolation layer. Then, in step S2500, a first layer of sacrificial material is formed over the first layer of structural material. A second layer of structural material is formed over the first layer of sacrificial material in step S2600. In step S2700, a second layer of sacrificial material is formed over the second layer of structural material. A protective layer is then formed over the second layer of sacrificial material in step S2800. A cut through the protective layer is made in step S2900 to expose part of the second layer of sacrificial material.

In step S3000, a third layer of sacrificial material is formed over the protective layer such that an interface is created between the third layer of sacrificial material and the second layer of sacrificial material. The third layer of sacrificial material is made of a material that is less susceptible to removal, such as by etching, than the second layer of sacrificial material. For example, the third layer of sacrificial material may be a nitride and the second layer of sacrificial material may be an oxide, forming a nitride/oxide interface at the cut in the protective layer.

The first and second layers of sacrificial material are removed in step S3100. For example, the first and second layers of sacrificial material may be subjected to a release etch, such as hydrofluoric acid, that is not allowed to significantly attack the materials of the other layers. Because the first and second layers of sacrificial material are completely covered by other layers, except for the sides, the etchant will attack the first and second layers of sacrificial material in a similar manner. Thus, both surfaces of the second layer of structural material disposed between the first and second layers of sacrificial material will have similar exposure to the etchant. Further, the interface at the cuts will decrease the required etching time as described above.

After the first and second layers of sacrificial material are removed, the third layer of sacrificial material and the protective layer may be removed in steps S3200 and S3300, respectively. The process then ends in step S1000.

Figure 13:
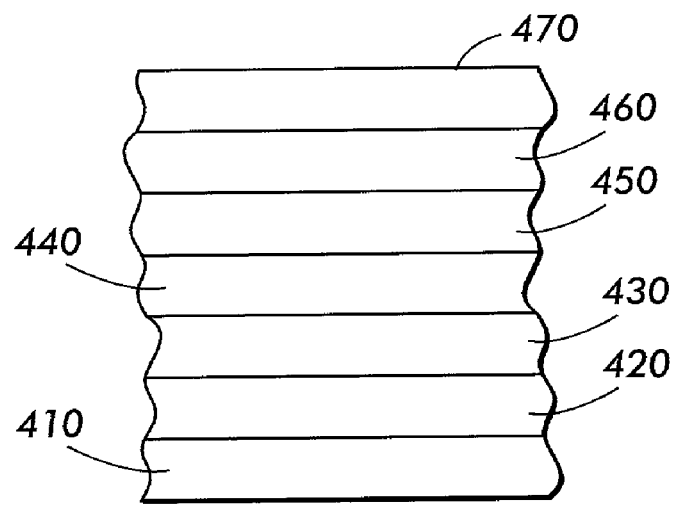
FIG. 13 is a partial cross-sectional view of a portion of the exemplary ejector of FIG. 1 in a stage of fabrication according to the third exemplary method of this invention, without a cut.
Figure 14:
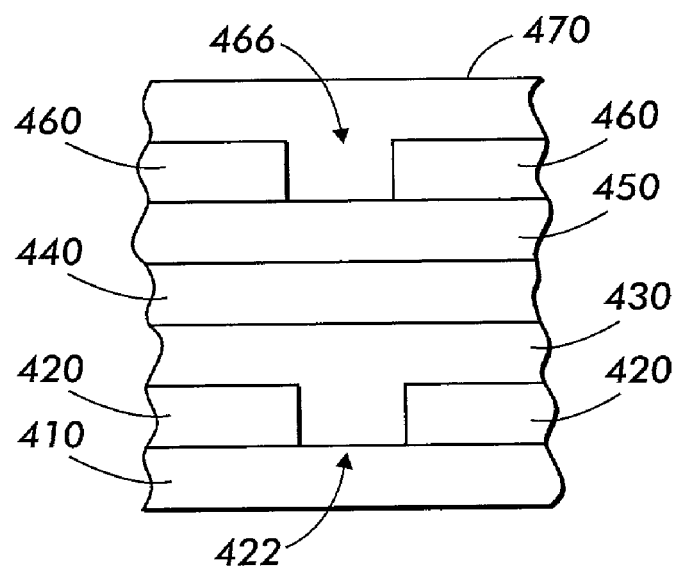
FIG. 14 is a partial cross-sectional view of another portion of the exemplary ejector of FIG. 1 in a stage of fabrication according to the third exemplary method of this invention, with a cut.

FIGS. 13 and 14 show partial cross-sections of the exemplary ejector of FIG. 1 in a stage of fabrication according to the third exemplary method of this invention. As with the previous embodiment, a first layer of structural material 420, which forms the electrode for the ejector, is formed over an isolation layer 410 and/or a substrate (not shown). The first layer of structural material 420 includes at least one cut 422. A first layer of a first sacrificial material 430 is formed over the first layer of structural material 420. The first layer of the first sacrificial material 430 forms an interface with the isolation layer 410 at the at least one cut 422.

As shown in FIGS. 13 and 14, a second layer of structural material 440, which forms the membrane structure of the ejector, is formed over the first layer of the first sacrificial material 430. A second layer of the first sacrificial material 450 is formed over the second layer of structural material 440.

According to the third exemplary method of this invention, a protective layer 460 is formed over the second layer of the first sacrificial material 450. As described above with respect to the first embodiment, the protective layer 460 may be formed on one or more support legs 462 that connect, for example, to the isolation layer 410. Again, the support legs 462 should be spaced apart or otherwise include through holes 464, as shown in FIG. 9, corresponding to the lateral etch holes formed in or between the membrane anchors to allow the etchant access.

As shown in FIG. 14, at least one cut 466 is formed in the protective layer 460. FIG. 13 shows a partial cross-section of a portion without a cut. A third layer 470 is formed over the protective layer 460. The third layer 470 should be made of a second material that is less susceptible to attack than the first sacrificial material. This will prevent the second layer of the first sacrificial material 450 from being attacked other than from the edge of the second layer of the first sacrificial material 450.

The third layer 470 forms an interface with the second layer of the first sacrificial material 450 at the at least one cut 466. Again, the at least one cut 466 may be formed as a channel as shown.

As described above, during the release etch, the etchant will remove the first layer of the first sacrificial material 430 and the second layer of the first sacrificial material 450 more rapidly at the respective cuts 422 and 466. This results in reduced etch time for the release etch to remove the first and second layers of the first sacrificial material 430 and 450. The cuts 422 and 466 allow the etchant to attack more areas of the first and second layers of the first sacrificial material 430 and 450 by channeling the etchant from the lateral etch holes and into the first and second layers of the first sacrificial material 430 and 450. As described above, the isolation layer 410 may be a nitride, such a silicon nitride, and the first sacrificial material may be an oxide, such as silicon dioxide. The second sacrificial material may be a nitride, such a silicon nitride.

While this invention has been described in conjunction with the exemplary embodiments outlined above, it is evident that many alternatives, modifications and variations will be apparent to those skilled in the art. Accordingly, the exemplary embodiments of the invention, as set forth above, are intended to be illustrative, not limiting. Various changes may be made without departing from the spirit and scope of the invention.

What is claimed is:

1. A method for fabricating a membrane of a structural material for a micro-device, comprising:
   forming a first layer of a first material;
   forming a first layer of structural material over the first layer of the first material;
   forming at least one cut in the first layer of structural material;
   forming a first layer of a sacrificial material, less resistant to removal than the first material, over the first layer of structural material such that an interface is created between the first material and the sacrificial material at the at least one cut in the first layer of structural material;
   forming a second layer of structural material over the first layer of sacrificial material; and
   subjecting the first layer of sacrificial material to a release etch to remove the first layer of the sacrificial material such that the second layer of structural material forms the membrane for the micro-device.

2. The method of claim 1, wherein forming the first layer of structural material comprises forming a layer of polysilicon.

3. The method of claim 1, wherein forming the first layer of structural material comprises forming a layer of single crystal silicon.

4. The method of claim 1, wherein forming the at least one cut in the first layer of structural material comprises forming at least one channel.

5. The method of claim 1, wherein:
forming the first layer of the first material comprises forming a first layer of nitride; and
forming the first layer of the sacrificial material comprises forming a first layer of oxide.

6. The method of claim 1, further comprising:
forming a second layer of a sacrificial material over the second layer of structural material;
forming a protective layer over the second layer of the sacrificial material;
forming at least one cut in the protective layer;
forming a second layer of a second material over the protective layer such that an interface is created between the second layer of the second material and the second layer of the sacrificial material at the at least one cut in the protective layer; and
subjecting the second layer of the sacrificial material to the release etch to remove the second layer of the sacrificial material.

7. The method of claim 6, wherein forming the first layer of structural material comprises forming a layer of polysilicon.

8. The method of claim 6, wherein forming the protective layer comprises forming a protective layer of polysilicon.

9. The method of claim 6, wherein forming the first layer of structural material comprises forming a layer of single crystal silicon.

10. The method of claim 6, wherein forming the protective layer comprises forming a protective layer of single crystal silicon.

11. A method for fabricating a membrane of a structural material for a micro-device, comprising:
forming a first layer of a first material:
forming a first layer of structural material over the first layer of the first material;
forming at least one cut in the first layer of structural material;
forming a first layer of a sacrificial material, less resistant to removal than the first material, over the first layer of structural material such that an interface is created between the first material and the sacrificial material at the at least one cut in the first layer of structural material;
forming a second layer of structural material over the first layer of sacrificial material;
subjecting the first layer of sacrificial material to a release etch to remove the first layer of the sacrificial material
forming a second layer of a sacrificial material over the second layer of structural material;
forming a protective layer over the second layer of the sacrificial material;
forming at least one cut in the protective layer;
forming a second layer of a second material over the protective layer such that an interface is created between the second layer of the second material and the second layer of the sacrificial material at the at least one cut in the protective layer;
subjecting the second layer of the sacrificial material to the release etch to remove the second layer of the sacrificial material; and
removing the protective layer after subjecting the first and second layers of sacrificial materials to the release etch.

12. The method of claim 11, wherein removing the protective layer is accomplished mechanically.

13. The method of claim 11, wherein removing the protective layer is accomplished chemically.

14. A method for fabricating a membrane of a structural material for a micro-device, comprising:
forming a first layer of a first material;
forming a first layer of structural material over the first layer of the first material;
forming at least one cut in the first layer of structural material;
forming a first layer of a sacrificial material, less resistant to removal than the first material, over the first layer of structural material such that an interface is created between the first material and the sacrificial material at the at least one cut in the first layer of structural material;
forming a second layer of structural material over the first layer of sacrificial material;
subjecting the first layer of sacrificial material to a release etch to remove the first layer of the sacrificial material
forming a second layer of a sacrificial material over the second layer of structural material;
forming a protective layer over the second layer of the sacrificial material;
forming at least one cut in the protective layer;
forming a second layer of a second material over the protective layer such that an interface is created between the second layer of the second material and the second layer of the sacrificial material at the at least one cut in the protective layer;
subjecting the second layer of the sacrificial material to the release etch to remove the second layer of the sacrificial material; and wherein:
forming the first layer of the first material comprises forming a first layer of nitride;
forming the first layer of the sacrificial material comprises forming a first layer of oxide;
forming the second layer of the second material comprises forming a second layer of nitride; and
forming the second layer of the sacrificial material comprises forming a second layer of oxide.

* * * * *